US009880250B2

(12) United States Patent
Gross et al.

(10) Patent No.: US 9,880,250 B2
(45) Date of Patent: Jan. 30, 2018

(54) METHOD AND MAGNETIC RESONANCE APPARATUS FOR IMAGE RECONSTRUCTION WITH MULTIPLE VIRTUAL COILS

(71) Applicant: SIEMENS AKTIENGESELLSCHAFT, Munich (DE)

(72) Inventors: Patrick Gross, Ismaning (DE); Rene Gumbrecht, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 650 days.

(21) Appl. No.: 14/504,758

(22) Filed: Oct. 2, 2014

(65) Prior Publication Data

US 2015/0091570 A1 Apr. 2, 2015

(30) Foreign Application Priority Data

Oct. 2, 2013 (DE) ......................... 10 2013 220 012

(51) Int. Cl.
*G01V 3/00* (2006.01)
*G01R 33/565* (2006.01)
(Continued)

(52) U.S. Cl.
CPC ... *G01R 33/56554* (2013.01); *G01R 33/5608* (2013.01); *G06T 11/005* (2013.01); *G01R 33/5611* (2013.01); *G06T 2211/424* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS 7,383,074 B2 * 6/2008 Shankaranarayanan A61B 5/055
600/407
7,449,888 B1 * 11/2008 Malik .............. G01R 33/34046
324/318
(Continued)

OTHER PUBLICATIONS

Kim et al. "Automatic Correction of Echo-Planar Imaging (EPI) Ghosting Artifacts in Real-Time Interactive Cardiac MRI Using Sensitivity Encoding"; Journal of Magnetic Resonance Imaging, vol. 27 (2008) pp. 239-245.
(Continued)

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

An MR image is produced from data acquired by radiating an RF pulse and switching multiple bipolar magnetic field gradients to generate multiple gradient echoes that are acquired in a raw data set with multiple raw data lines by a reception coil, the multiple gradient echoes being acquired with bipolar magnetic field gradients of different polarity. Due to the bipolar magnetic field gradients of different polarity, in the raw data set first raw data lines are filled with MR signals in one direction in raw data space, and second raw data lines are filled with MR signals in the opposite direction. The MR image is reconstructed from MR signals that have simultaneously been acquired with at least two different reception coils, by generating a first coil raw data set from the raw data set in the image reconstruction, which coil raw data set has only the raw data lines of the raw data set that were filled with MR signals in one direction, and by selecting a second coil raw data set that has only the raw data lines of the raw data set that were filled with MR signals in the other set direction. The MR image is reconstructed from the two coil raw data sets using a parallel imaging reconstruction algorithm, under the assumption that the two coil raw data sets have been acquired by different reception coils.

7 Claims, 4 Drawing Sheets

(51) Int. Cl.
  *G01R 33/56*  (2006.01)
  *G06T 11/00*  (2006.01)
  *G01R 33/561*  (2006.01)

(58) Field of Classification Search
  USPC .......................................................... 324/309
  See application file for complete search history.

(56) References Cited

U.S. PATENT DOCUMENTS

2006/0273792 A1* 12/2006 Kholmovski ...... G01R 33/5611
  324/309
2008/0116891 A1* 5/2008 van der Kouwe . G01R 33/5616
  324/312

OTHER PUBLICATIONS

Poser et al. "Single-Shot Echo-Planar Imaging With Nyquist Ghost Compensation: Interleaved Dual Echo With Acceleration (IDEA) Echo-Planar Imaging (EPI)," Magnetic Resonance in Medicine, vol. 69 (2013) pp. 37-47.

Hoge et al. "Robust EPI Nyquist Ghost Elimination via Spatial and Temporal Encoding," Magnetic Resonance in Medicine; vol. 64 (2010) pp. 1781-1791.

\* cited by examiner

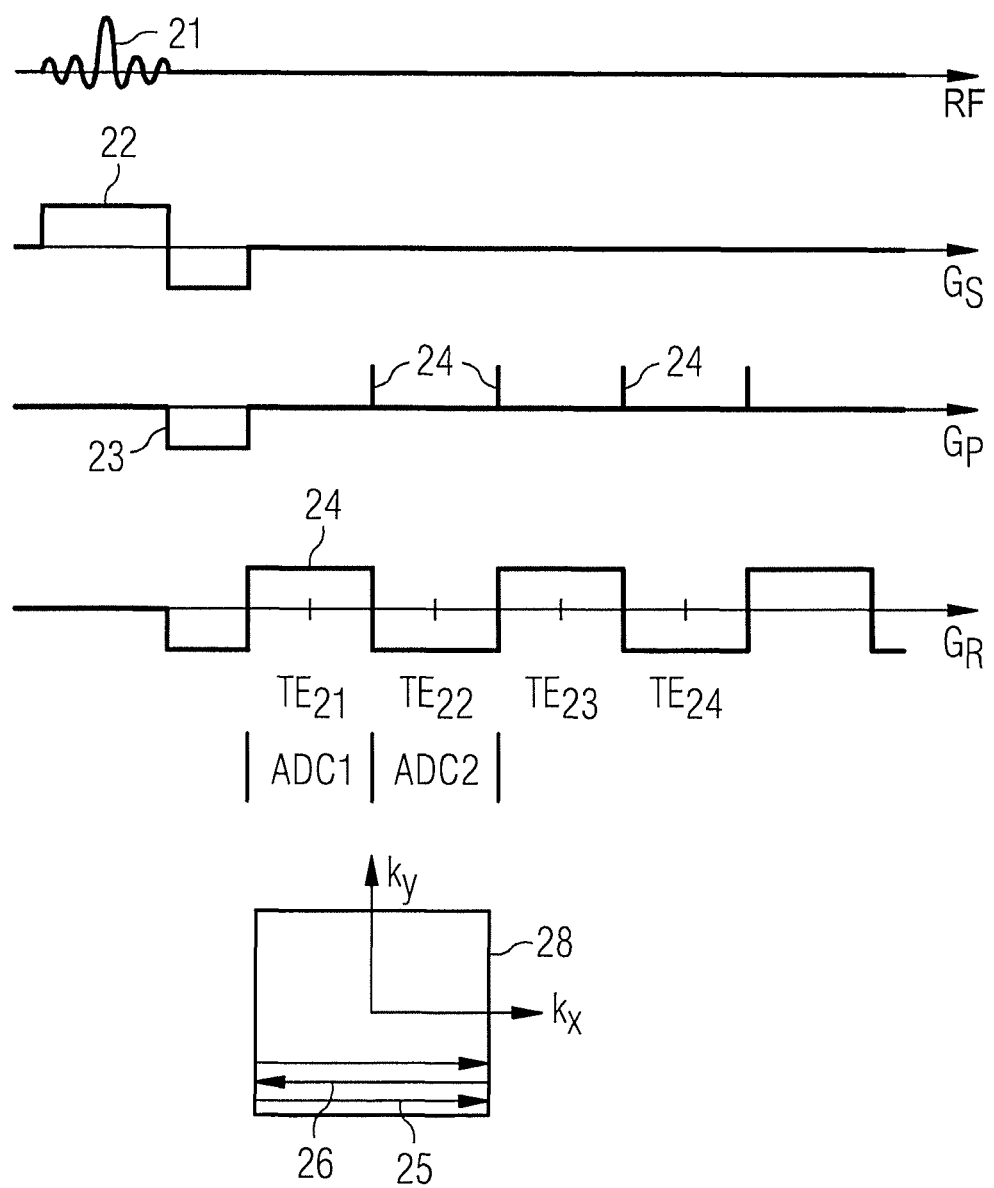

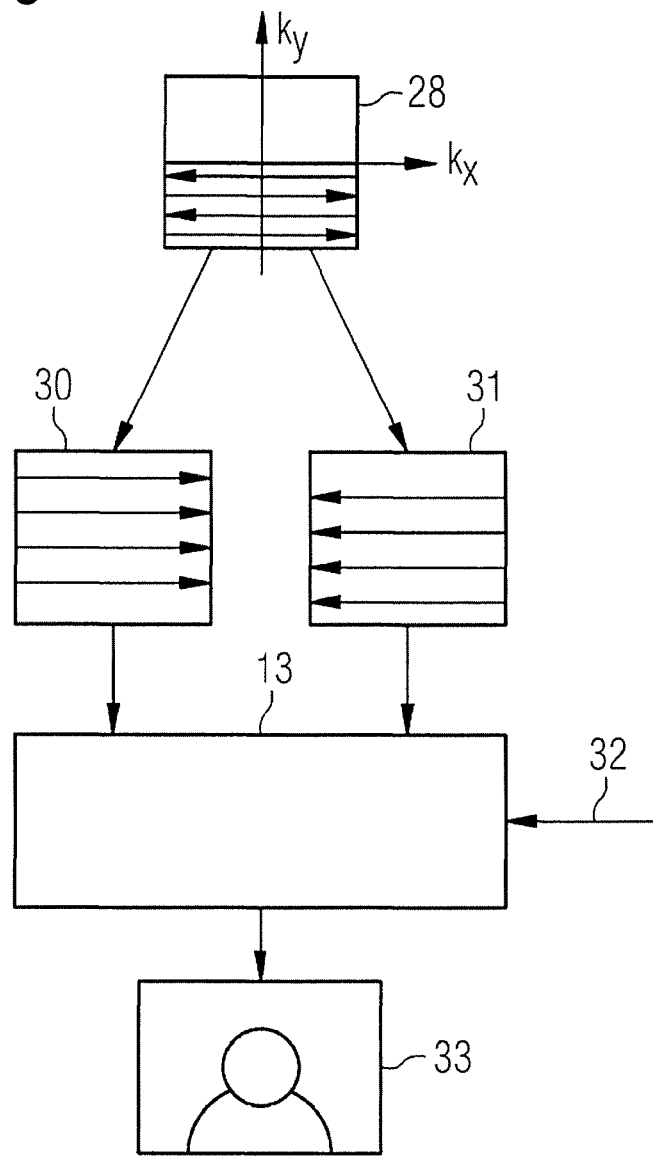

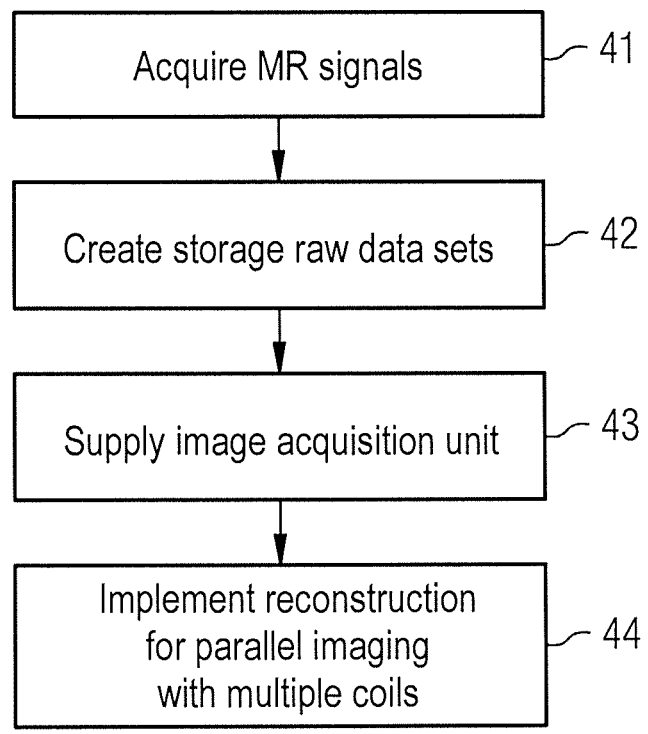

METHOD AND MAGNETIC RESONANCE APPARATUS FOR IMAGE RECONSTRUCTION WITH MULTIPLE VIRTUAL COILS

BACKGROUND OF THE INVENTION

Field of the Invention

The present invention concerns a method to generate an MR image, wherein the MR signals are gradient echoes, and an MR system for implementing such a method.

Description of the Prior Art

In the acquisition of MR images with imaging sequences wherein multiple gradient echoes are read out after the radiation of an RF pulse (known as multiecho sequences), for time reasons and for a better signal-to-noise ratio it is typical to activate what are known as bipolar magnetic field gradients with different polarity. For example, a first gradient echo is switched by a negative magnetic field gradient for dephasing the spins, and the echo is generated by a positive magnetic field gradient. The last portion of the positive magnetic field gradient dephases the excited nuclear spins again, and a magnetic field gradient with opposite polarity (a negative magnetic field gradient in the above example) is switched again to generate an additional echo at a later echo point in time.

The echoes generated with gradients of different polarity are typically designated as even and odd echoes in order to indicate that these echoes have been acquired with bipolar gradients of different polarity. In such readout methods, one challenge is that the even and odd echoes do not both occur exactly in the middle of a readout window, due to the different polarity. This means that the signal depends on the direction in which the associated raw data domain (k-space) is filled with raw data. This slight displacement (shift) in the readout time window leads to a phase shift for the gradient echoes with a first bipolar alignment that differs from the phase shift of the other echo with the opposite bipolar alignment. When a magnitude image is generated from the different MR signals, these different phase shifts play no role. However, if the phase information were to be used, for example for the Dixon technique, for a B0 mapping or for a phase depiction, or for a depiction of the susceptibility, it is difficult to combine these even and odd echoes. In order to be able to completely separately reconstruct the images, both must have complete k-space coverage. In order to reconstruct previous data sets with even and odd echoes, either a complete even data set and a complete odd data set needed to be acquired (which takes longer) or greater artifacts must be accepted given undersampled images.

SUMMARY OF THE INVENTION

An object of the present invention is to prevent at least some of the aforementioned disadvantages and to provide possibilities to simply combine even and odd echoes for a multiecho sequence.

According to a first aspect of the present invention, a method is provided to generate an MR image, in which an RF pulse is radiated and multiple bipolar magnetic field gradients are switched to generate multiple gradient echoes. The gradient echoes generated after the radiation of an RF pulse are received by a reception coil in a raw data set with multiple raw data lines, and the multiple gradient echoes are acquired with bipolar magnetic field gradients of different polarity so that, due to the bipolar magnetic field gradients of different polarity, first raw data lines in the raw data set in the raw data domain (k-space) are filled with MR signals in one direction while second raw data lines are filled with MR signals in the opposite direction. An MR image is subsequently reconstructed by an image reconstruction unit using the acquired gradient echoes as represented in k-space. This image reconstruction unit is designed to generate the MR image from MR signals that have been acquired simultaneously with at least two different reception coils. In the image reconstruction, the image reconstruction unit generates from the raw data set a first coil raw data set that has only the raw data lines of the raw data set that have been filled with MR signals in one direction. Furthermore, a second coil raw data set is generated that has only the raw data lines of the raw data set that have been filled with MR signals in the other, opposite direction. The image reconstruction unit then reconstructs the image from the two coil raw data sets under the assumption that the two coil raw data sets have been acquired simultaneously by different reception coils. The image reconstruction unit thus reconstructs an MR image from the raw data set generated by a reception coil as if one of the coil raw data sets would have been acquired by a first reception coil and the other coil raw data set would have been acquired by another reception coil.

The reconstruction thus takes place as if the two coil raw data sets would have come from different virtual reception coils. As noted above, the time shift in the even and odd echoes leads to a phase shift in the corresponding images. However, these different phases also occur given parallel reconstruction techniques in which multiple coils simultaneously receive the MR signals. Since parallel reconstruction techniques with multiple coils are precisely adapted to such a simulation, they can therefore handle it and generate an MR image from the two coil raw data sets.

For example, the image reconstruction unit can reconstruct the MR image from the two coil raw data sets, for example as is known via the multi-coil method according to GRAPPA, SENSE or SMASH.

The image reconstruction unit can hereby operate such that, in the reconstruction of the MR image, it determines the missing raw data lines in the first coil raw data set (i.e. the raw data line for the other direction) from the raw data lines of the other coil raw data set that has the raw data lines for the other direction.

It is likewise possible for the image reconstruction unit to use respective coil-dependent calibration data from a calibration raw data set in the reconstruction of the missing raw data lines in a coil raw data set. The coil-dependent calibration raw data set has only raw data lines in which said raw data lines have been filled with MR signals in one direction. There is thus a calibration raw data set for the first virtual coil that has only raw data lines that have been filled with MR signals in the one direction, while the other calibration raw data set of the other virtual coil has only raw data lines that have been filled with raw data in the opposite direction.

Furthermore, in the reconstruction of the missing raw data lines, it is possible to use the associated calibration raw data set (i.e. the raw data set with raw data lines in this one direction) in a coil raw data set in which raw data lines in one direction are included. The missing raw data lines of the raw data space are reconstructed with the calibration raw data set, the raw data lines from the other raw data set in which the raw data lines have been filled with the MR data in the opposite direction, and with the existing raw data lines of the coil raw data set in which the raw data lines run in the one direction. This means that the missing raw data lines are reconstructed with the associated calibration raw data set of the corresponding virtual coil, the separate raw data and the raw data lines of the other coil raw data set. For example, if the raw data set includes only even echoes, the missing raw data lines are thus calculated with the coil sensitivity or the calibration raw data set that was filled only with even echoes. Furthermore, the raw data lines from the raw data set of the odd echoes are used in order to reconstruct the missing lines in the raw data set with even echoes.

It is thus possible, for the coil-dependent calibration raw data set, that the entire raw data space is not filled with MR signals, but rather only a partial region around the center of the raw data space is filled.

The invention furthermore concerns an MR system with an RF unit to radiate the RF pulse; a magnetic field gradient unit that generates bipolar magnetic field gradients with different polarity as described above; and an image reconstruction unit that, as is explained above, is designed to generate the MR image from MR signals that were actually acquired simultaneously with at least two different reception coils, although the signal has been acquired only with one reception coil.

BRIEF DESCRIPTION OF THE DRAWINGS

FIG. 2 schematically shows a sequence diagram and filling of a raw data space (k-space) with MR signals with the system of FIG. 1.

FIG. 3 schematically shows how an MR image is reconstructed according to the invention from the acquired raw data lines.

FIG. 4 is a flowchart of the basic steps that are implemented to generate an MR image, as described in connection with FIGS. 2 and 3.

DESCRIPTION OF THE PREFERRED EMBODIMENTS

Figure 1:
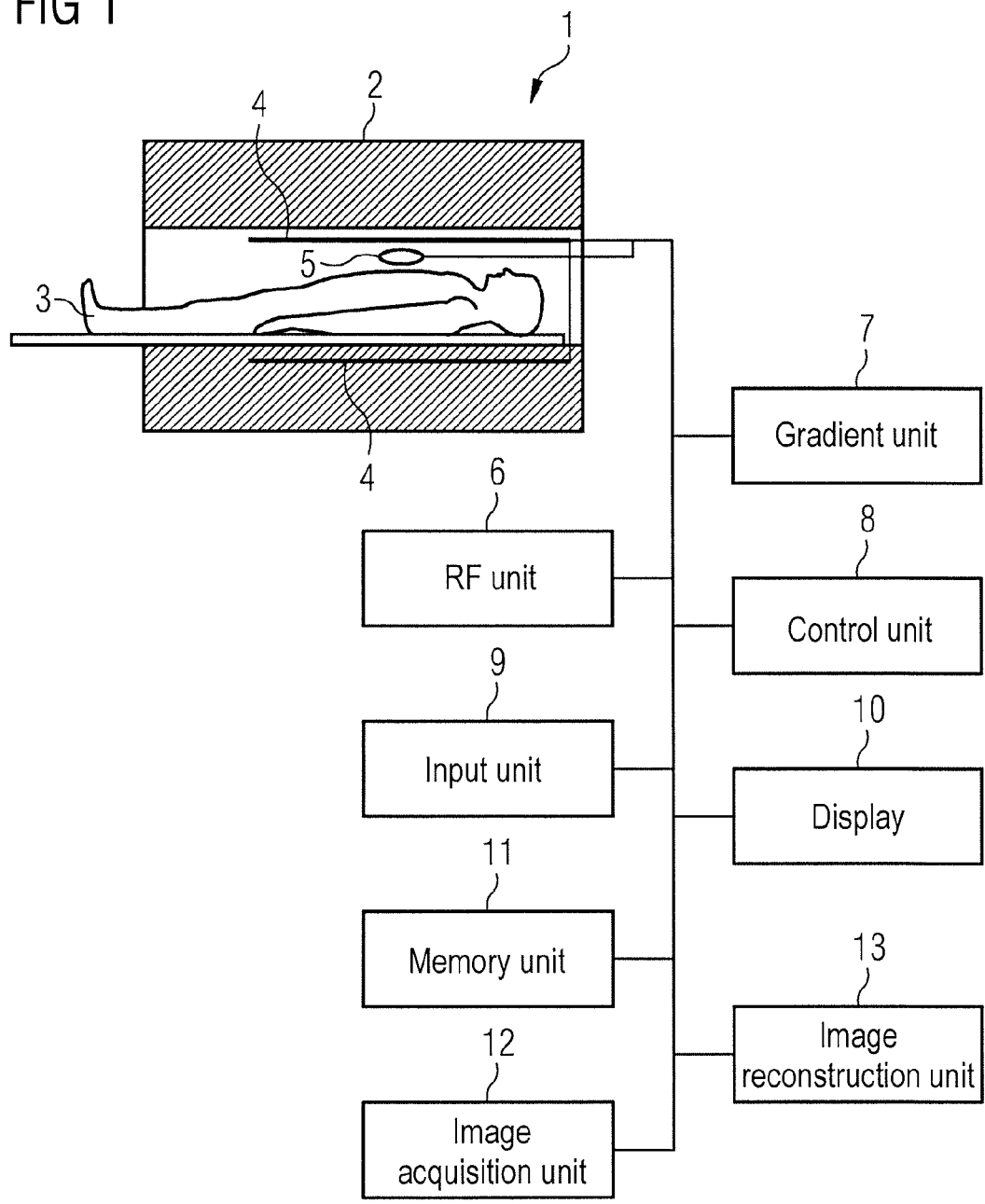
FIG. 1 schematically shows an MR system with which MR images can be generated, by reconstruction from echoes that were acquired with different bipolar gradients, using an image reconstruction algorithm for parallel (multi-coil) imaging.

In the following, an embodiment in which MR images are generated from a raw data set in which gradient echoes are used that were acquired with reversed bipolar magnetic field gradients is described with reference to the accompanying drawings.

The MR system 1 shown in FIG. 1 has a magnet 2 that generates a polarization field B0 to generate a polarization in a patient or the examined person 3. The MR system has gradient coils 4 to generate magnetic field gradients. A reception coil 5 detects the MR signals from the examined person. The reception coil 5 can also be used as a transmission coil, or a body coil (not shown) can be used to radiate RF pulses.

The RF pulses are generated by an RF unit 6, and the magnetic field gradients are generated by a gradient unit 7.

A central control unit 8 controls the MR system. An operator can input the desired information and control the MR system via an input unit 9. For example, imaging sequences or other information can be stored in a memory unit 11. An image acquisition unit 12 is provided that establishes the sequence of RF pulses and magnetic field gradients depending on the desired imaging sequence, and that stores the MR signals detected by the coil 5 in raw data space to generate MR raw data that then form the basis for the reconstruction of an MR image. The image reconstruction takes place in an image reconstruction unit 13 that is designed to reconstruct an MR image with MR signals that were acquired simultaneously by different coils, for example with the GRAPPA, SENSE or SMASH technique.

The manner by which MR signals are detected using the sequence of RF pulses and magnetic field gradients, and how MR images are reconstructed in general, are known to those skilled in the art and need not be explained in detail herein.

Naturally, the MR system can have additional units that are not shown for clarity. Furthermore, the various units can be realized other than in the depicted separation of the individual units. It is possible that the different components are assembled into units or that different units are combined with one another. The units (depicted as functional units) can be designed as hardware, software or a combination of hardware and software.

In FIG. 2, an imaging sequence for the generation of gradient echoes is shown. In the shown case, the depicted imaging sequence is an echoplanar imaging sequence (EPI imaging sequence) in which the entire raw data space is filled with MR signals either entirely or to the extent desired after a single excitation pulse 21. The slice selection takes place via simultaneous switching of a slice selection gradient 22 during the excitation pulse 21, and a phase coding gradient 23 first has a negative pre-portion followed by what are known as short blips 24 with which the phase coding direction is coded. The readout gradient 24 is composed of a series of bipolar magnetic field gradients with different polarity, such that the different signal echoes are generated at the points in time T1–T4 . . . . The number of generated echoes depends on the number of k-space lines that should be filled with raw data. Furthermore, in FIG. 2 a first raw data line 25 is shown that contains raw data from the signal echo at T1, while the raw data line 26 has the raw data of the signal echo at T2. The signal readout takes place in the readout window ADC1, ADC2, . . . .

In the shown embodiment, the entirety of k-space is filled with raw data. However, it is also possible that the entire raw data space is not filled with raw data after an RF excitation, but instead the raw data space is filled with raw data in individual segments, such that, in each segment, only a defined number of k-space lines (such as the lines 25 and 26) is acquired. In another embodiment, the imaging sequence is a multiecho sequence in which the same k-space line is read out (has raw data entered therein) multiple times for different echo times after radiation of an RF pulse (such as the RF pulse 22), with the signal readout being repeated with another phase coding gradient after an additional RF pulse in order to read out a different k-space line repeatedly for different echo times. In this embodiment, for each echo time TE, a raw data set can then be generated that includes raw data lines that are filled with raw data in one direction and raw data lines that are filled with raw data in the opposite direction.

The imaging sequence can be any imaging sequence in which a raw data line is filled with raw data once in the one direction, wherein another raw data line in the opposite direction is filled with raw data due to the reversal of the polarity of the magnetic field gradient. If a raw data set that has k-space lines that were filled with raw data in the one direction and other k-space lines that were filled with raw data in the other direction has now been generated like the raw data set 28, then as explained in detail in connection with FIG. 3, a reconstruction can be implemented that can avoid or reduce image artifacts that arise because—due to the magnetic field gradients of different polarity—the signal echoes are not situated exactly in the middle of a readout time window. The readout time windows ADC1, ADC2 are shown as examples in FIG. 2. As noted above, bipolar gradient fields with different polarity led to signal echoes that have a certain phase shift relative to one another depending on the selected polarity of the readout gradient. In the present invention, it has been recognized that this is precisely the situation that occurs given the reconstruction in parallel imaging if multiple MR reception coils receive the same MR signal. The image reconstruction unit that is shown in FIG. 1 uses reconstruction Techniques—for example as are known under the terms GRAPPA, ITERATIVE SENSE, SENSE or SMASH—to reconstruct an MR image.

For this, the raw data set 28 is separated into what are known as two coil raw data sets 30 and 31. These two coil raw data sets then simulate the raw data sets given which the image acquisition unit 12 assumes that they have been acquired with different coils, and said image acquisition unit 12 treats these coil raw data sets as if they would have been acquired by different coils. As is typical in parallel imaging, the entire raw data lines are not acquired in raw data space, but rather only a portion of these lines are filled, and the other raw data lines are reconstructed with the raw data lines of the other coil and known coil characteristics. Although not shown in FIG. 3, the generation of the two coil raw data sets can be implemented in the image reconstruction unit 13 so that the sequence shown in FIG. 3 is implemented in the image reconstruction unit 13.

As is shown in FIG. 3, the one coil raw data set 30 has only the raw data lines that were filled with MR data in one direction, while the other coil raw data set 31 has the raw data lines that were acquired in the opposite direction. The two coil raw data sets 30 and 31 suggest that they were acquired by two different (virtual) coils, whereas they have been acquired by a single coil. In the shown case, each coil raw data set has only raw data lines that take up approximately 50% of the entire raw data space. The one coil raw data set has only even echoes and the other coil raw data set has only the odd echoes. These two coil raw data sets 30, 31 are supplied to the image reconstruction unit, which then reconstructs an MR image 33 under consideration of the two coil raw data sets. As indicated by the arrow 32, the image reconstruction unit can hereby use calibration data of the different virtual coils. For example, a calibration data set of a virtual coil can be a data set acquired with an reception coil, which data set has only even or only odd echoes.

This has the advantage that the raw data space for the even and odd coil data sets does not need to be acquired for the same raw data lines in the event that the entire raw data space is half-filled with even echoes, and the other half is filled with odd echoes.

As is known from parallel imaging, in parallel reconstruction techniques, data of raw data lines that were not filled is calculated using raw data in k-space lines filled by raw data acquired with another coil, and with the use of a coil characteristic. For the determination of such a coil characteristic, for example, raw data can be acquired with the one reception coil, wherein the same bipolar gradient direction has been used given all raw data lines, and wherein the raw data space is filled only in a partial region—for example, only the center is filled with raw data. For each virtual coil, a virtual calibration raw data set is thereby generated that can be used in order to reconstruct the missing raw data lines in the coil raw data sets. For example, the virtual coil raw data set can be generated with raw data that were generated with even echoes. For the coil raw data set that has only even echoes, the missing raw data lines can then be reconstructed from the coil raw data set with odd echoes and the calibration data set for the virtual coil with even echoes.

Such a method cancels the effect of the chemical shift and B0 effects that would typically lead to opposite distortions in the images that would be generated from even or odd echoes.

The steps with which an MR data set can be generated and acquired as described above, and with which an MR image can be reconstructed, are summarized in FIG. 4.

After acquisition of the MR signals in Step 41, in Step 42 the coil raw data sets can be generated as shown in FIG. 3. In Step 42, the data set 28 is divided up into two coil raw data sets 30 and 31. In Step 43, these different coil raw data sets are then supplied to the image reconstruction unit, which is designed to reconstruct images that have been acquired simultaneously by different reception coils. In Step 44, the reconstruction of the MR image in the image reconstruction unit takes place via parallel reconstruction methods as they are known via GRAPPA, SENSE or SMASH, for example.

The imaging sequence described in FIG. 2 is described as a two-dimensional imaging sequence. Naturally, the method is also usable for 3D acquisition techniques. Furthermore, a Cartesian filling of the raw data space has been described in FIG. 2. Naturally, the present invention is also possible given a non-Cartesian filling of the raw data space.

Although modifications and changes may be suggested by those skilled in the art, it is the intention of the inventors to embody within the patent warranted hereon all changes and modifications as reasonably and properly come within the scope of their contribution to the art.

We claim as our invention:

1. The method to produce a magnetic resonance (MR) image, comprising
    operating an MR data acquisition unit, in which a subject is situated, by radiating a radio frequency (RF) pulse and activating multiple bipolar magnetic field gradients to excite nuclear spins in the subject and to generate multiple gradient echoes resulting from the excited nuclear spins;
    operating the MR data acquisition unit to acquire raw data representing said multiple gradient echoes with a single reception coil of the MR data acquisition unit, and entering said raw data into respective raw data lines in an electronic memory organized as raw data space, with multiple raw data sets being acquired respectively for said multiple gradient echoes during activation of said bipolar magnetic field gradients with first raw data lines in raw data space being filled, in each raw data set, in a first direction by said bipolar magnetic field gradient having a first polarity and second raw data lines in each raw data set being filled in an opposite direction by said bipolar magnetic field gradient having a second polarity;
    in a computer, reconstructing an MR image from the raw data in said electronic memory, using a reconstruction algorithm designed to reconstruct said MR image from raw data simultaneously acquired with at least two different reception coils and, in said reconstruction algorithm, generating a first coil raw data set comprised only of raw data lines that were filled with raw data in said one direction, and generating a second coil raw data set comprising only raw data lines that were filled with raw data in said other direction, and reconstructing said MR image using said generated first and second coil raw data sets in said algorithm as if the raw data in said generated first and second coil raw data sets were acquired by different reception coils, and making the reconstructed MR image available at an output of said computer in electronic form as a data file.

2. A method as claimed in claim 1 comprising, in said computer, reconstructing said MR image by automatically determining any raw data in raw data lines that are missing in said first coil raw data sets from raw data in raw data lines of said second coil raw data set.

3. A method as claimed in claim 2 comprising reconstructing said MR image using, as said algorithm, a reconstruction algorithm selected from the group consisting of GRAPPA, SENSE, and SMASH.

4. A method as claimed in claim 2 comprising, in said computer, generating a coil-dependent calibration raw data set comprising only data from raw data lines that are filled with raw data only in one direction, and using said coil-dependent calibration data to form a calibration raw data set, and using said calibration raw data set to reconstruct raw data from said missing lines.

5. A method as claimed in claim 4 comprising filling missing raw data lines with said calibration raw data set in one of said first or second coil raw data sets, and reconstructing said MR image using said one of said first and second raw data sets, and the other of said first and second coils raw data sets.

6. A method as claimed in claim 5 comprising filling said missing raw data lines with said calibration raw data set only in portions thereof around a center of raw data space.

7. A magnetic resonance (MR) apparatus comprising:

an MR data acquisition unit comprising a radio-frequency (RF) system and a gradient system;

a control unit configured to operate the MR data acquisition unit, in which a subject is situated, by radiating a radio frequency pulse with said RF system and activating multiple bipolar magnetic field gradients with said gradient system, to excite nuclear spins in the subject and to generate multiple gradient echoes resulting from the excited nuclear spins;

an electronic memory;

said control unit being configured to operate the MR data acquisition unit to acquire raw data representing said multiple gradient echoes with a single reception coil of the MR data acquisition unit, and to enter said raw data into respective raw data lines in said electronic memory organized as raw data space, with multiple raw data sets being acquired respectively for said multiple gradient echoes during activation of said bipolar magnetic field gradients with first raw data lines in raw data space being filled, in each raw data set, in a first direction by said bipolar magnetic field gradient having a first polarity and second raw data lines in each raw data set being filled in an opposite direction by said bipolar magnetic field gradient having a second polarity;

a computer configured to reconstruct an MR image from the raw data in said electronic memory, using a reconstruction algorithm designed to reconstruct said MR image from raw data simultaneously acquired with at least two different reception coils and, in said reconstruction algorithm, said computer being configured to generate a first coil raw data set comprised only of raw data lines that were filled with raw data in said one direction, and generating a second coil raw data set comprising only raw data lines that were filled with raw data in said other direction, and to reconstruct said MR image using said generated first and second coil raw data sets in said algorithm as if the raw data in said generated first and second coil raw data sets were acquired by different reception coils, and said computer being configured to make the reconstructed MR image available at an output of said computer in electronic form as a data file.

* * * * *